(12) United States Patent
Chen et al.

(10) Patent No.: US 10,832,610 B2
(45) Date of Patent: Nov. 10, 2020

(54) DISPLAY PANEL OF MICRO LIGHT EMITTING DIODE

(71) Applicant: PLAYNITRIDE INC., Zhubei (TW)

(72) Inventors: Pei-Hsin Chen, Tainan (TW); Yi-Ching Chen, Tainan (TW); Yi-Chun Shih, Tainan (TW); Yu-Chu Li, Tainan (TW); Ying-Tsang Liu, Tainan (TW)

(73) Assignee: PLAYNITRIDE INC., Zhubei (TW)

( * ) Notice: Subject to any disclaimer, the term of this patent is extended or adjusted under 35 U.S.C. 154(b) by 0 days.

(21) Appl. No.: 16/388,628

(22) Filed: Apr. 18, 2019

(65) Prior Publication Data

US 2019/0325803 A1 Oct. 24, 2019

(30) Foreign Application Priority Data

Apr. 18, 2018 (TW) ................................ 107113116

(51) Int. Cl.
*H01L 27/15* (2006.01)
*G09G 3/20* (2006.01)
*G09G 3/32* (2016.01)
*G06F 3/041* (2006.01)

(52) U.S. Cl.
CPC ......... *G09G 3/2003* (2013.01); *G06F 3/0412* (2013.01); *G09G 3/32* (2013.01); *H01L 27/156* (2013.01); *G06F 2203/04107* (2013.01)

(58) Field of Classification Search
CPC ...... G09G 3/2003; G09G 3/32; G06F 3/0412; H01L 27/156
See application file for complete search history.

(56) References Cited

U.S. PATENT DOCUMENTS

2019/0115333 A1* 4/2019 Wu ..................... H01L 25/0753
2019/0198490 A1* 6/2019 Li ........................... H01L 25/18
2020/0052048 A1* 2/2020 Kuo .................... H01L 27/3276
2020/0152612 A1* 5/2020 Chen ...................... H01L 33/58
2020/0219862 A1* 7/2020 Han ...................... H01L 25/167

FOREIGN PATENT DOCUMENTS

TW           M554170 U       1/2018

* cited by examiner

*Primary Examiner* — Mark W Tornow
(74) *Attorney, Agent, or Firm* — Maschoff Brennan (57) ABSTRACT

A display panel of micro light emitting diode comprises a substrate, a plurality of micro light emitting diodes, a plurality of driving chips and a shading layer. The substrate having a first surface and a display area. The plurality of micro light emitting diodes is disposed on the first surface of the substrate and is located in the display area, with each of the micro light emitting diodes having a light emitting surface while the light emitting surface is away from the first surface of the substrate. The plurality of driving chips is disposed on the first surface of the substrate and is located in the display area, with each driving chip electrically connecting to at least one of the micro light emitting diodes. The shading layer is disposed on the first surface of the substrate and covering the driving chips while exposing the light emitting surfaces.

12 Claims, 7 Drawing Sheets

DISPLAY PANEL OF MICRO LIGHT EMITTING DIODE

CROSS-REFERENCE TO RELATED APPLICATIONS

This non-provisional application claims priority under 35 U.S.C. § 119(a) on Patent Application No(s). 107113116 filed in Taiwan, R.O.C. on Apr. 18, 2018, and the entire contents of which are hereby incorporated by reference.

TECHNICAL FIELD

This disclosure is related to a display panel of light emitting diode, particularly to a display panel of micro light emitting diode.

BACKGROUND

Light emitting diodes have high energy transformation efficiencies, small size and long life time, and have been widely adapted in various kinds of electronic products. Light emitting diodes are usually utilized for instruction, illuminating or image display. Briefly, a common light emitting diode has an active light emitting layer and at least two semiconductor layers of different doping types. Manufacturers have been able to produce light emitting diode of different colors via adjusting the material of the active light emitting layer.

However, fine controls are acquired for utilizing light emitting diodes in displaying image and is beyond the capability of the amorphous silicon thin film transistor circuit disposed on the glass substrate. Especially for high resolution display panel, light emitting diode with small size and driven by low current is adapted, and thus the related industries focus their researches on how to raise the current control accuracy and improve the display quality recently.

SUMMARY

According to one or more embodiment of this disclosure, a display panel of micro light emitting diode comprises a substrate, a plurality of micro light emitting diodes, a plurality of driving chips and a shading layer. The substrate having a first surface and a display area. The plurality of micro light emitting diodes is disposed on the first surface of the substrate and is located in the display area, with each of the micro light emitting diodes having a bottom surface and a light emitting surface located at two opposite sides of the corresponding micro light emitting diode respectively, wherein the bottom surface is close to the first surface while the light emitting surface is away from the first surface. The plurality of driving chips is disposed on the first surface of the substrate and is located in the display area, with each of the driving chips electrically connected to at least one of the micro light emitting diodes. The shading layer is disposed on the first surface of the substrate and covers the driving chips, wherein the light emitting surfaces of the micro light emitting diodes are exposed by the shading layer, with a thickness of the micro light emitting diode being less than half of a thickness of the driving chip.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

This disclosure provides a display panel of micro light emitting diode. The display panel of micro light emitting diode includes a substrate, a plurality of micro light emitting diodes, a plurality of driving chips and a shading layer. Figures with micro light emitting diodes and driving chips are exemplified for embodiments in this disclosure, but the numbers and the specifications of the micro light emitting diodes and driving chips are not limited to the figures. In the other hand, although each micro light emitting diode shown in the figures has a lateral structure, the micro light emitting diodes in this disclosure can also be served by those of vertical structure. Besides, the display panel of micro light emitting diode has a plurality of pixels and different components. For convenient illustration, partial structures of the display panel of micro light emitting diode are exemplified. The whole structure of the display panel of micro light emitting diode can be inferred from this disclosure by a person having ordinary skill in the art.

Figure 1A:
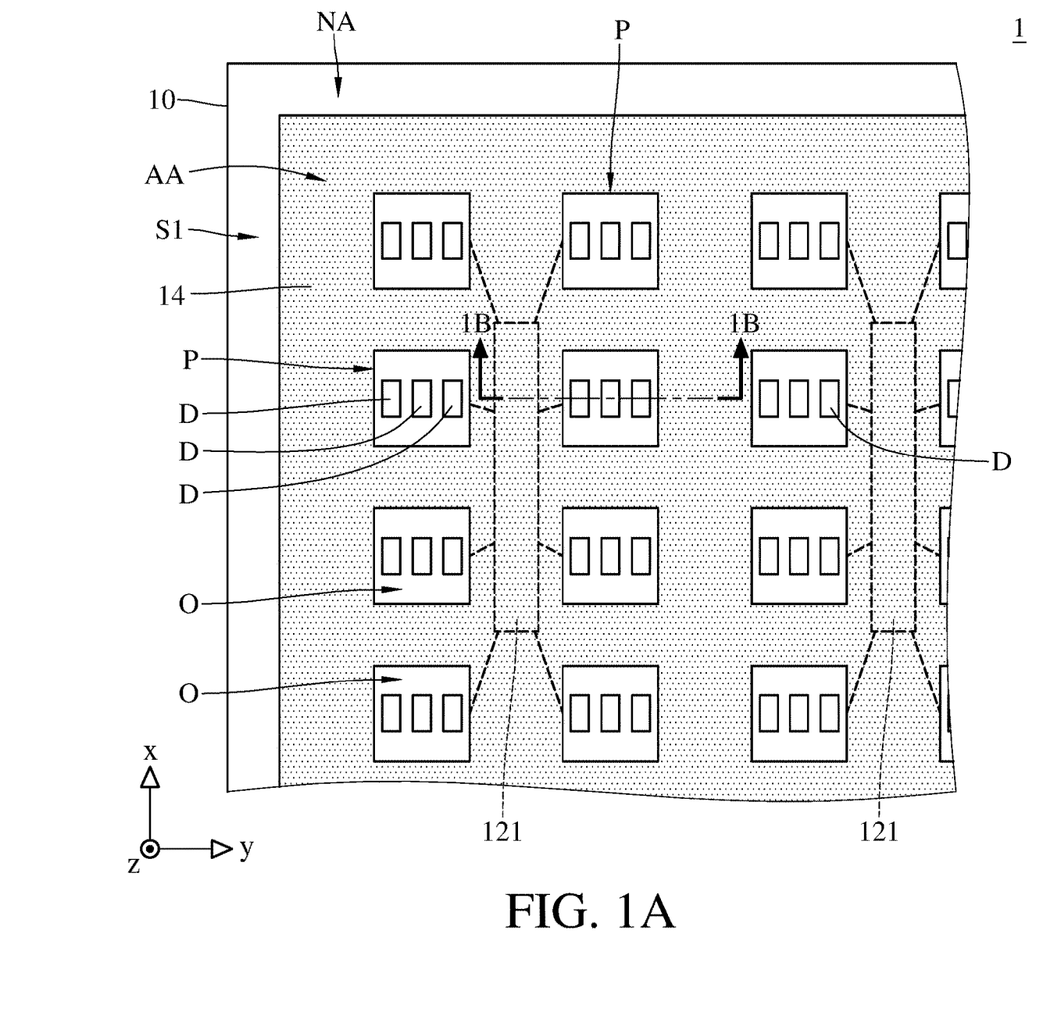
FIG. 1A is a top view of a display panel of micro light emitting diode according to one embodiment of this disclosure.
Figure 1B:
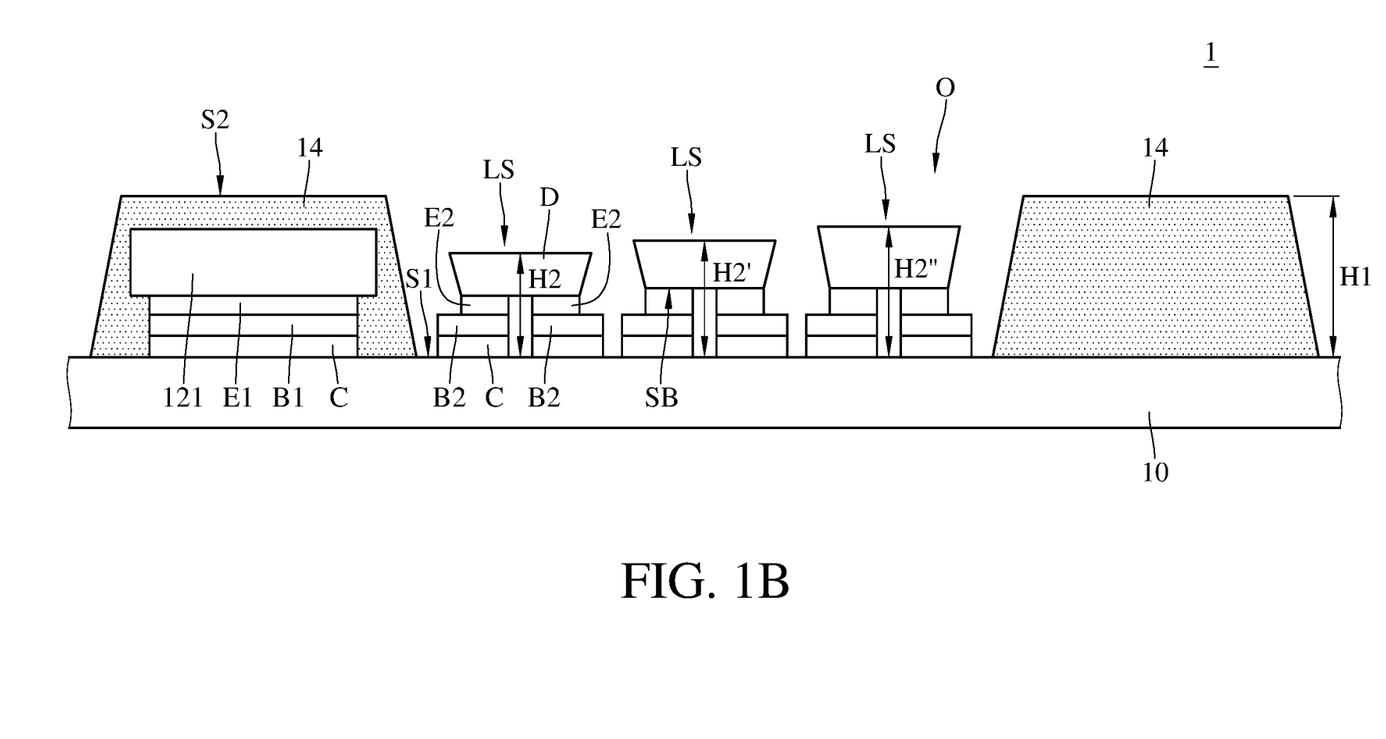
FIG. 1B is a cross-section view of 1B-1B cross section of a display panel of micro light emitting diode in FIG. 1A of this disclosure.

FIGS. 1A and 1B are referred herein. FIG. 1A is a top view of a display panel of micro light emitting diode according to one embodiment of this disclosure. FIG. 1B is a cross-section view of 1B-1B cross section of the display panel of micro light emitting diode in FIG. 1A of this disclosure. The display panel of micro light emitting diode 1 includes a substrate 10, a plurality of driving chips 121, a plurality of micro light emitting diodes D and a shading layer 14. The substrate 10 has a first surface S1, an display area AA and a non-display area NA. The display area AA is the area configured to display an image. There is a plurality of separated and array-arranged pixels P disposed in the display area AA. Each pixel P in this disclosure includes a plurality of micro light emitting diodes D; the non-display area NA is in the periphery of the display area AA and is configured to accommodate circuits, wirings or other components, such as camera lens.

The plurality of micro light emitting diodes D is electrically connected to the substrate 10 and disposed on the first surface S1. Each micro light emitting diode D has a light emitting surface LS and a bottom surface SB, with the light emitting surface LS and the bottom surface SB located at two opposite sides of the corresponding micro light emitting diode D respectively. The bottom surface SB is close to and faces toward the first surface S1 while the light emitting surface LS is away from the first surface S1. In this embodiment, each micro light emitting diode D further includes two electrodes E2 disposed on the bottom surface SB. The first surface S1, the bottom surface SB and the light emitting surface LS are parallel to each other. That is, the bottom surface SB is between the first surface S1 and the light emitting surface LS. Each pixel P includes three micro light emitting diodes D configured to provide red light, green light and blue light, wherein said three micro light emitting diodes are a red micro light emitting diode (R micro LED), a green micro light emitting diode (G micro LED) and a blue micro light emitting diode (B micro LED) respectively. The above structures of the pixels P are exemplified only and this disclosure is not limited thereto.

The plurality of driving chips 121 are also electrically connected to the substrate 10 and are disposed in the display area AA. One of the driving chips 121 is electrically connected to the micro light emitting diodes D in the corresponding pixels P so as to control and drive the electrically connected micro light emitting diodes D, instructing each pixel P to emit light with a preordained color and a preordained brightness. The driving chips 121 may comprise integrated circuits manufactured through semiconductor processes. In this embodiment, one driving chip 121 drives the micro light emitting diodes D in eight pixels P correspondingly. In practice, one or more than one of said driving chips 121 can be configured to drive one or more than one of micro light emitting diodes D in one or more than one of the pixels P and thus the connection between the driving chips 121 and the micro light emitting diodes D is not limited to the embodiments of this disclosure.

The display panel of micro light emitting diode 1 further includes a display driving circuit C. In this embodiment, the display driving circuit C comprises conductive wirings disposed on the first surface S1 of the substrate 10 and is configured to electrically connect to the driving chip 121 and corresponding ones of the micro light emitting diode D. In other embodiments, the display driving circuit C can further comprise transistors.

In practice, a pin E1 of the driving chip 121 is electrically connected to the display driving circuit C through a corresponding bump B1 while an electrode E2 of the micro light emitting diode D is electrically connected to the display driving circuit C through a corresponding bump B2. The wiring pattern of the display driving circuit C is corresponding to the connection between the pin E1 of the driving chip 121 and the electrode E2 of the micro light emitting diode D, and specific implementation is not certified hereby.

The shading layer 14 can be disposed on the substrate 10 via photoresist coating on the substrate 10 and thus is thick enough to cover the driving chip 121. The shading layer 14 is patterned by exposure and development so that the micro light emitting diodes are exposed by the shading layer 14. In this embodiment, the patterned shading layer 14 covers every driving chip 121 and includes a plurality of openings O respectively corresponding to the pixels P. The micro light emitting diodes D and a part of the display driving circuit C are in the corresponding openings O, exposed by the shading layer 14. Specifically, the orthographic projection of the shading layer 14 on the first surface S1 surrounds each pixel P respectively. That is, the orthographic projection of the shading layer 14 on the first surface S1 does not overlap the orthographic projection of each micro light emitting diode D on the first surface S1, and thus the light emitting surface LS of each micro light emitting diode D is exposed by the shading layer 14, with a thickness of the micro light emitting diode D being less than half of a thickness of the driving chip 121. In another aspect, the plurality of micro light emitting diodes D is not covered by the shading layer 14 and the driving chips 121 are all covered by the shading layer 14. In practice, the material of the shading layer 14 is, for example, black matrix resist, opaque glue materials, multi-layer chromium film or resin.

Specifically, the shading layer 14 has a second surface S2 away from the first surface S1. The distance H1 between the first surface S1 and the second surface S2 is larger than the distances H2, H2', H2" between the light emitting surface LS of corresponding micro light emitting diodes D and the first surface S1. As a result, the shading layer 14 can ease or avoid the mutual light interference between different pixels, and thus the contrast of the images provided by the proposed display panel is improved relatively to conventional display panels. In other words, the light emitting surfaces LS of the micro light emitting diodes D are not above the second surface S2 of the shading layer 14.

Besides, in this embodiment, the distances H2, H2', H2" are corresponding to micro light emitting diodes D configured to provide lights of different colors respectively, wherein the distances H2, H2', H2" are different. As a result, damages to the micro light emitting diodes D already transferred to the substrate 10 due to collisions during transfer of the micro light emitting diodes D from a temporary substrate to the substrate 10 in batches can be avoided. Specifically, the transfer sequence of the micro light emitting diodes D can be set according to the distances between the light emitting surface LS of the micro light emitting diodes D and the first surface S1. In this embodiment, the micro light emitting diodes D corresponding to the minimum distance H2 is transferred firstly while the micro light emitting diodes D corresponding to the medium distance H2' are the next ones and the micro light emitting diodes D corresponding to the maximum distance H2" are in the last batches. The distance between the light emitting surfaces LS and the first surface S1 is at least related to the thickness of the micro light emitting diode D which comprises the thickness of the epitaxy layer (not marked in the figures) and the thickness of the electrodes E2. In this embodiment, the distance between the respective light emitting surface LS of each micro light emitting diode D and the first surface S1 is for example only and is not limited thereto. In other embodiments, the distance between the light emitting surfaces LS and the first surface S1 can be adjusted by means of adjusting the thicknesses of the bumps B2, adjusting the thickness of the display driving circuit C or adjusting the pattern of the first surface S1.

In this embodiment, the shading layer 14 surrounds each pixel P respectively. In another aspect, the shading layer 14 does not contact the micro light emitting diodes D. Except for being configured to cover the driving chips 121 to avoid performance degradations of the driving chips 121 due to illumination, the shading layer 14 is further configured to ease or avoid the mutual interference between the lights from the micro light emitting diodes D in different pixels P. On the other hand, the contrast of the images provided by the display panel of micro light emitting diode 1 can be raised via surrounding each pixel P with the shading layer 14 higher than the micro light emitting diodes D.

Figure 2A:
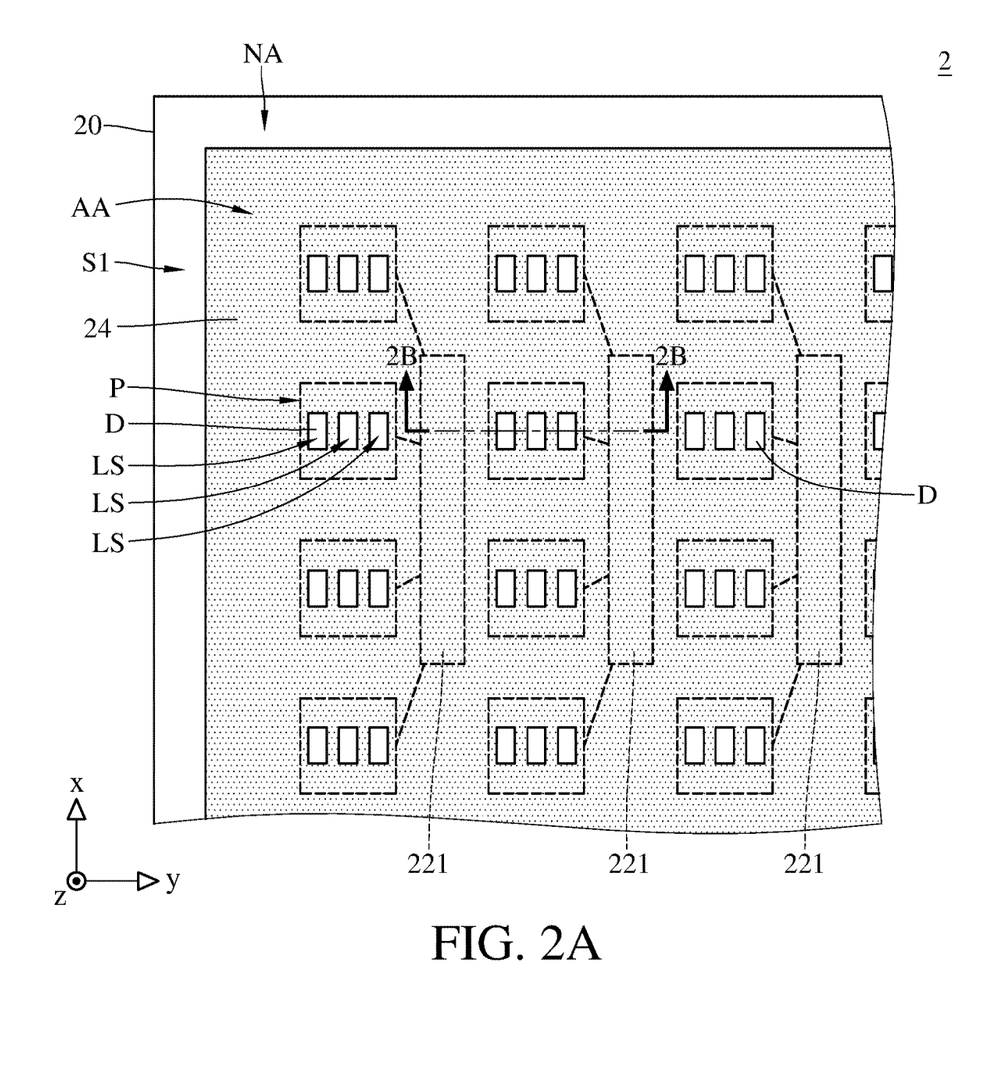
FIG. 2A is a top view of a display panel of micro light emitting diode according to another embodiment of this disclosure.
Figure 2B:
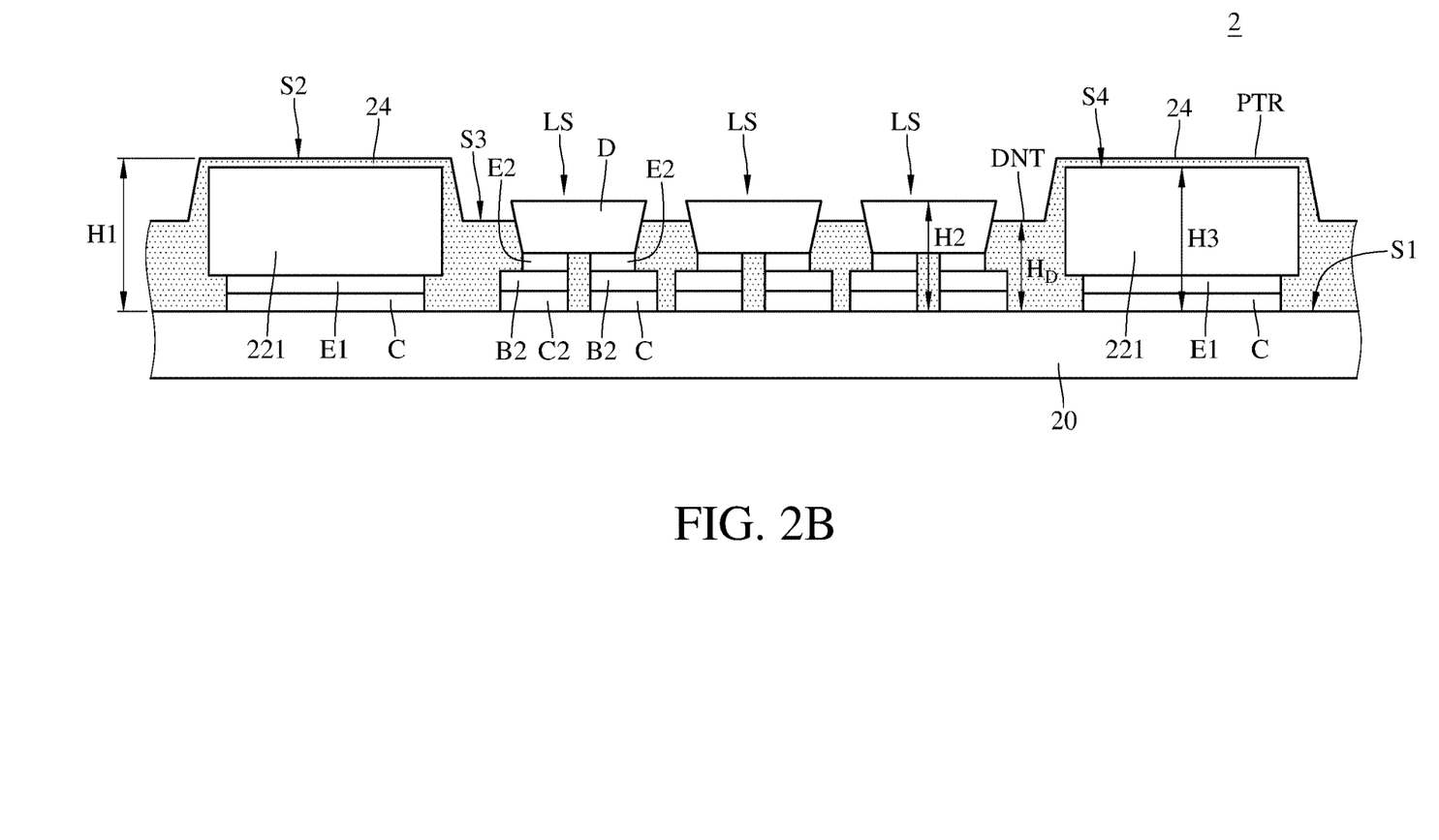
FIG. 2B is a cross-section view of 2B-2B cross section of a display panel of micro light emitting diode in FIG. 2A of this disclosure.

Please refer to FIG. 2A and FIG. 2B. FIG. 2A is a top view of a display panel of micro light emitting diode according to another embodiment of this disclosure, and FIG. 2B is a cross-section view of 2B-2B cross section of a display panel of micro light emitting diode in FIG. 2A of this disclosure.

The display panel of micro light emitting diode 2 in the FIG. 2A is similar to the display panel of micro light emitting diode 1. The display panel of micro light emitting diode 2 in the embodiment corresponding to FIG. 2A comprises a substrate 20, a plurality of driving chips 221 disposed on the first surface S1 of a substrate 20, a plurality of micro light emitting diodes D and a shading layer 24. The primary difference between the embodiments of FIG. 1A and FIG. 2A is that the shading layer 24 has protuberance parts PTR and dented parts DNT formed in connection and each driving chip 221 is corresponding to four pixels P. The shading layer 24 is coated on the first surface S1 of the substrate 20, covering the driving chip 221 and surrounding a part of sides of each micro light emitting diode D. The light emitting surface LS of each micro light emitting diode D is exposed by the shading layer 24, with a thickness of the micro light emitting diode D being less than half of a thickness of the driving chip 221. That is, in this embodiment, a portion of the structure of each micro light emitting diode D is exposed by the shading layer 24 while another portion of structure is covered by the shading layer 24.

Furthermore, the shading layer 24 covers the driving chip 221 and the display driving circuit C. Moreover, the protuberance part PTR of the shading layer 24 is corresponding to the driving chips 221 and covers the driving chips 221. The dented part DNT of the shading layer 24 is corresponding to the micro light emitting diodes D and covers the display driving circuit C and a part of the micro light emitting diode D. Specifically, the shading layer 24 has second surfaces S2 and third surfaces S3, wherein the second surfaces S2 are the surfaces of the protuberance parts PTR and the third surfaces S3 are the surfaces of the dented parts DNT. The micro light emitting diodes D are in the dented parts DNT, wherein the orthographic projections of the third surface S3 of the dented parts DNT on the first surface S1 partially overlap the orthographic projections of the micro light emitting diodes D on the first surface S1. In another way, being different from the embodiment of FIG. 1B, the shading layer 24 extends into the pixels P in which the micro light emitting diodes D locates. On the other hand, the distances HD between the first surface S1 and the surfaces of the dented parts DNT are less than the distances H2 between the first surface S1 and the light emitting surfaces LS. That is, in this embodiment, a portion of epitaxy structure of each micro light emitting diode D is exposed by the dented part DNT of the shading layer 24 and is not covered by the shading layer 24. In this embodiment, each driving chip 221 has a first top surface S4. There is a distance H3 between the first top surface S4 and the first surface S1. The distance H3 is larger than the distance H2 and the protuberance parts PTR of the shading layer 24 cover the driving chips 221 so that the distances H1 between the surfaces (second surfaces S2) of the protuberance part PTR and the first surface S1 are larger than the distances H2 between the light emitting surfaces LS of the micro light emitting diodes D and the first surface S1.

This embodiment utilizes the shading layer 24 to cover the display driving circuit C in the display area AA, easing the illumination influence on the components of the driving circuit C and avoid the display quality degradation due to reflected light.

Figure 3:
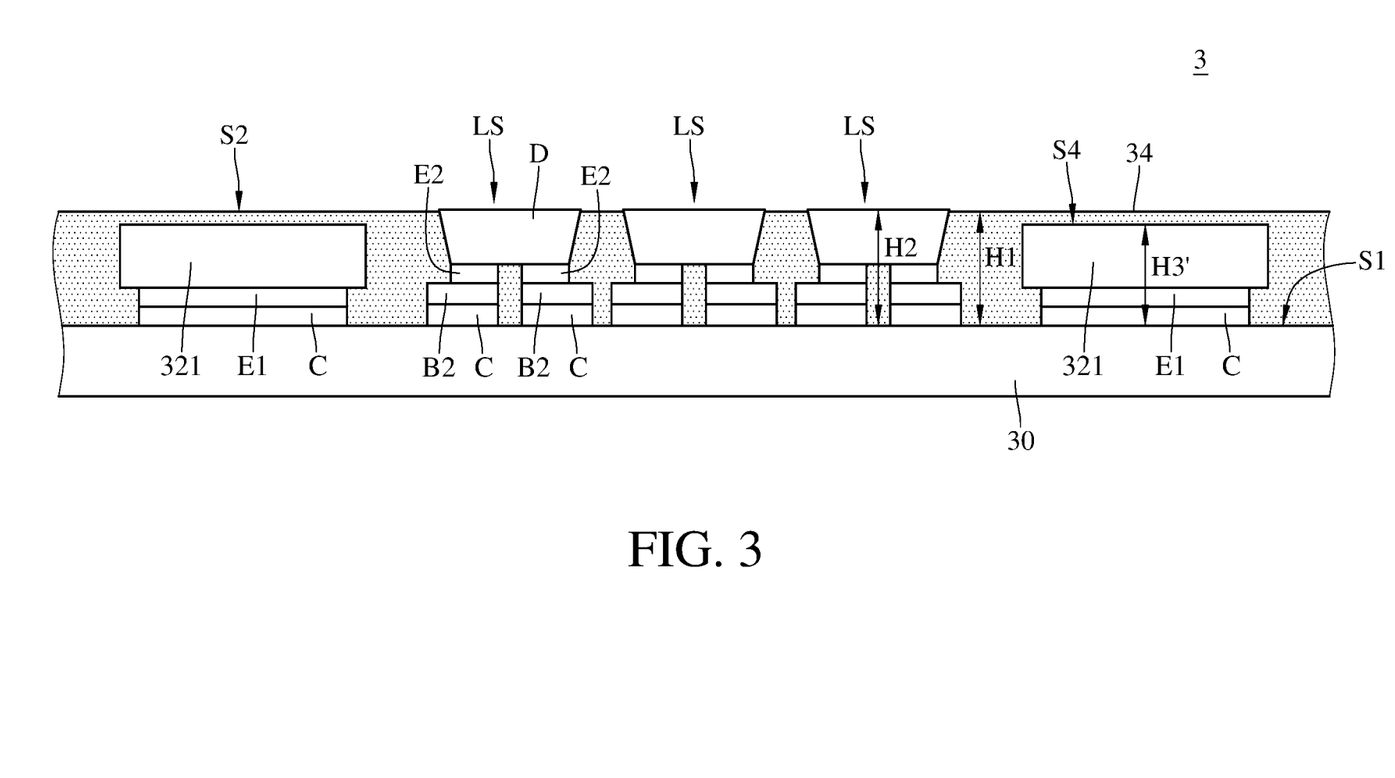
FIG. 3 is a cross-section view of a display panel of micro light emitting diode according to further another embodiment of this disclosure.

FIG. 3 is referred herein. FIG. 3 is a cross-section view of a display panel of micro light emitting diode according to further another embodiment of this disclosure. The display panel of micro light emitting diode 3 is similar to the display panel of micro light emitting diode 2 in FIG. 2B. The display panel of micro light emitting diode 3 in this embodiment includes a substrate 30, a plurality of driving chips 321 disposed on the first surface S1 of a substrate 30, a plurality of micro light emitting diodes D and a shading layer 34. The main difference between the embodiments of FIG. 2 and FIG. 3 is that the distance between the driving chips 321 and the first surface S1 is less than the distance between the micro light emitting diode D and the first surface S1. Therefore, in this embodiment, the shading layer 34 is not defined with dented parts DNT or protuberance parts PTR as FIG. 2B while thickness control for coating of the shading layer 34 is performed to make the shading layer 34 thick enough to cover the driving chips 321, with the light emitting surfaces LS exposed by the shading layer 34, wherein a thickness of the micro light emitting diode D is less than half of a thickness of the driving chip 321. In another aspect, the shading layer 34 has second surfaces S2 and the driving chips 321 have first top surfaces S4. There is a distance H1 between the first surface S1 and each second surface S2 of the shading layer 34, a distance H2 between the first surface S1 and the light emitting surface LS of each micro light emitting diode D, and a distance H3' between the first surface S1 and the first top surface S4 of each driving chip 321. The distance H3' is less than the distance H1 and the distance H1 is less than the distance H2.

Figure 4:
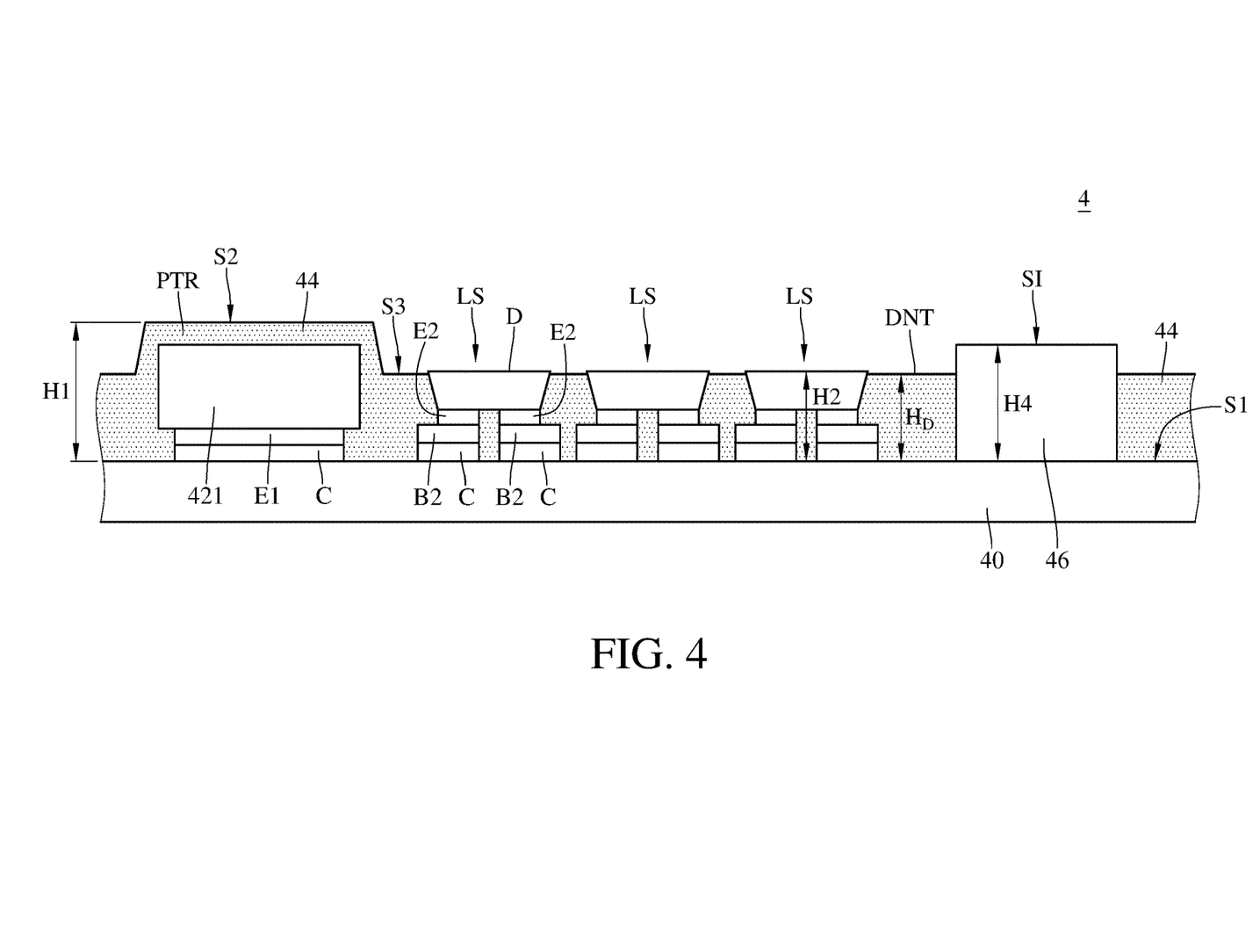
FIG. 4 is a cross-section view of a display panel of micro light emitting diode according to further another embodiment of this disclosure.

Please refer to FIG. 4. FIG. 4 is a cross-section view of a display panel of micro light emitting diode according to further another embodiment of this disclosure. The display panel of micro light emitting diode 4 is similar to the display panel of micro light emitting diode 2 in FIG. 2B. The display panel of micro light emitting diode 4 comprises a substrate 40, a plurality of driving chips 421 disposed on the first surface S1 of a substrate 40, a plurality of micro light emitting diodes D and a shading layer 44, with a thickness of the micro light emitting diode D being less than half of a thickness of the driving chip 421. The main difference between the display panel of micro light emitting diode 4 and the previous embodiment is that the display panel of micro light emitting diode 4 further comprises a sensing component 46 which can be a photosensitive component and is deposited in the display area AA. The second top surface SI of the sensing component 46 is exposed by the shading layer 44. Similar to the embodiment shown in FIG. 2B, the shading layer 44 is defined with protuberance parts PTR and dented parts DNT. The protuberance parts PTR cover the driving chips 421. The micro light emitting diodes D and the sensing component 46 are in the dented parts DNT. As mentioned previously, the shading layer 44 has second surfaces S2 and third surfaces S3, wherein each second surface S2 is a surface of the protuberance part PTR and each third surface S3 is a surface of the dented part DNT. The driving chip 421 has a first top surface S4. There is a distance H1 between the first surface S1 and the second surface S2 of the shading layer 44, a distance H2 between the light emitting surface LS of each micro light emitting diode D and the first surface S1, a distance HD between the first surface S1 and each dented part DNT, and a distance H4 between the second top surface SI of the sensing component 46 and the first surface S1, wherein the distance HD is less than the distance H2, the distance HD is less than the distance H4, and the distance H1 is larger than the distance H2.

Figure 5:
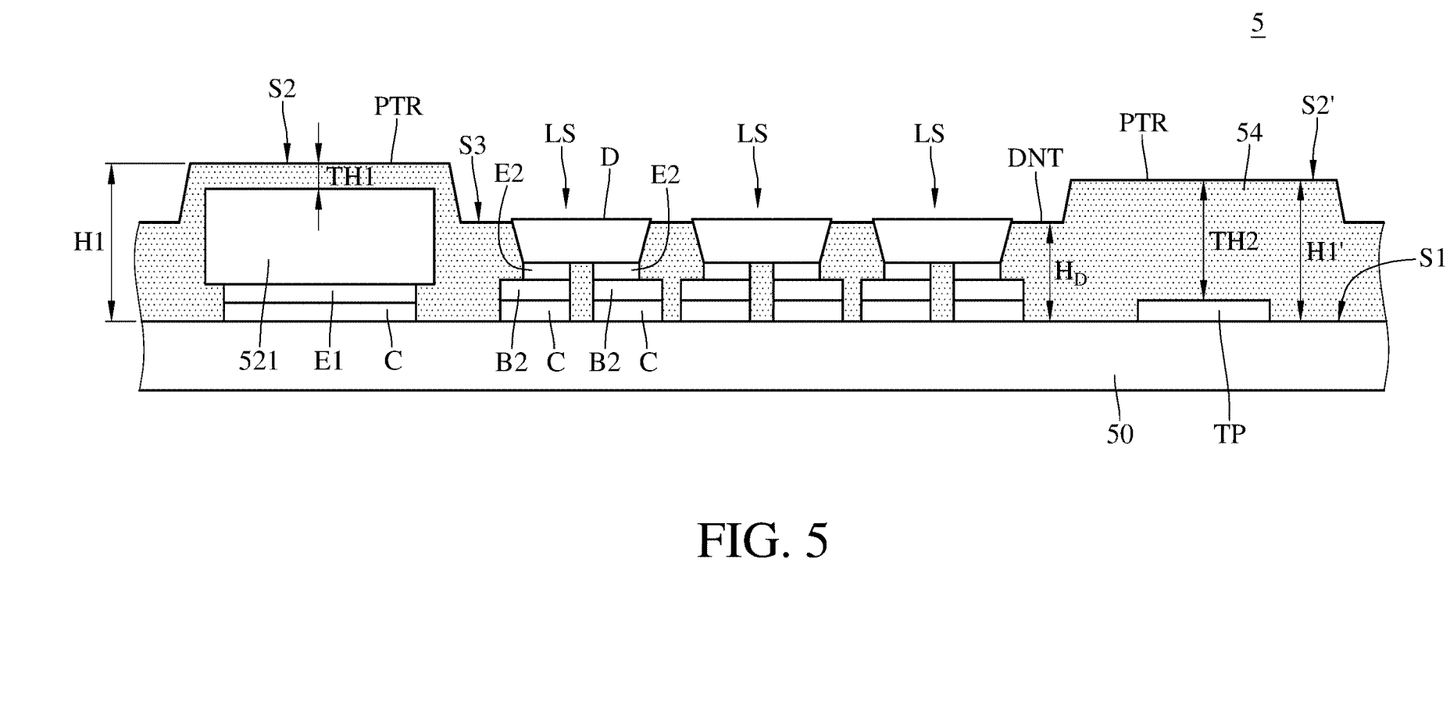
FIG. 5 is a cross-section view of a display panel of micro light emitting diode according to further another embodiment of this disclosure.

Please refer to FIG. 5. FIG. 5 is a cross-section view of a display panel of micro light emitting diode according to further another embodiment of this disclosure. The display panel of micro light emitting diode 5 in this embodiment is similar to the embodiment of FIG. 4. The main difference is that the display panel of micro light emitting diode 5 further comprises a touch component TP. The touch component TP is a sensing wiring disposed on the substrate 50 and is configured to sense touches in this embodiment. The protuberance parts PTR cover the driving chips 521 and the touch component TP. The micro light emitting diodes D are in the dented part DNT and the light emitting surfaces LS of the micro light emitting diodes D are exposed by the dented parts DNT. Particularly, a thickness TH1 of a corresponding protuberance part PTR of the shading layer 54 overlapping the driving chip 521 is different from a thickness TH2 of a corresponding protuberance part PTR of the shading layer 54 overlapping the touch component TP. In another aspect, the shading layer 54 has two second surfaces S2 and S2'. The second surface S2 is the surface of a corresponding protuberance part PTR covering a corresponding driving chip 521. The other second surface S2' is the surface of a corresponding protuberance part PTR covering a corresponding touch component TP. In this embodiment, the distance H1 between the second surface S2 and the first surface S1 is larger than the distance H1' between the second surface S2' and the first surface S1.

In view of the above, this disclosure provides a display panel of micro light emitting diode including a shading layer for covering the integrated circuit on the substrate, preventing electronic parameters of components of said integrated circuit from variation due to illumination. Besides, the shading layer can be further configured to cover other components on the substrate to avoid display quality degradation due to light reflected by the components. In one embodiment, the shading layer has dented parts and protuberance parts to raise the contrast of images provided by the display panel of micro light emitting diode more significantly. Furthermore, for one type of embodiments, the display panel of micro light emitting diode further includes a detector. The shading layer can be configured to cover the detector or not according to the type of the detector.

What is claimed is:

1. A display panel of micro light emitting diode, comprising:
   a substrate having a first surface and a display area;
   a plurality of micro light emitting diodes disposed on the first surface of the substrate and located in the display area, wherein each of the micro light emitting diodes has a bottom surface and a light emitting surface located at two opposite sides of the corresponding micro light emitting diode respectively, wherein the bottom surface of the micro light emitting diode is close to the first surface of the substrate while the light emitting surface is away from the first surface of the substrate;
   a plurality of driving chips disposed on the first surface of the substrate and located in the display area and separated from the micro light emitting diodes, wherein each of the driving chips electrically connects to at least one of the micro light emitting diodes; and
   a shading layer disposed on the first surface of the substrate and covering the driving chips, wherein the light emitting surfaces of the micro light emitting diodes are exposed by the shading layer, wherein a thickness of the micro light emitting diode is less than half of a thickness of the driving chip.

2. The display panel of micro light emitting diode according to claim 1, further comprising a display driving circuit on the substrate, electrically connected to the micro light emitting diodes and the driving chips, wherein the shading layer has a plurality of openings and the micro light emitting diodes are in the openings.

3. The display panel of micro light emitting diode according to claim 2, wherein the shading layer has a second surface, and a distance between the second surface of the shading layer and the first surface of the substrate is larger than a distance between the first surface of the substrate and any one of the light emitting surfaces.

4. The display panel of micro light emitting diode according to claim 1, wherein the shading layer has a plurality of dented parts and a plurality of protuberance parts, and the micro light emitting diodes are disposed in the dented parts and the driving chips are disposed in the protuberance parts, and a distance between the first surface of the substrate and a surface of any one of the dented parts is less than another distance between the first surface of the substrate and the light emitting surface of any one of the micro light emitting diodes, and further another distance between a surface of any one of the protuberance parts and the first surface of the substrate is larger than the other distance between the first surface of the substrate and the light emitting surface of any one of the micro light emitting diodes.

5. The display panel of micro light emitting diode according to claim 1, wherein one of the driving chips has a first top surface, and a distance between the first top surface and the first surface of the substrate is larger than a distance between the first surface of the substrate and the light emitting surface.

6. The display panel of micro light emitting diode according to claim 1, further comprising a sensing component disposed on the substrate, located in the display area of the substrate, and covered by the shading layer.

7. The display panel of micro light emitting diode according to claim 1, further comprising a sensing component disposed on the substrate and located in the display area of the substrate, wherein a second top surface of the sensing component is exposed by the shading layer.

8. The display panel of micro light emitting diode according to claim 7, wherein the shading layer includes a plurality of dented parts and a plurality of protuberance parts, and the micro light emitting diodes and the sensing component are disposed in the dented parts and the driving chips are disposed in the protuberance parts, wherein a distance between a surface of any one of the dented parts and the first surface of the substrate is less than a distance between the first surface of the substrate and the light emitting surface of any one of the micro light emitting diodes, and a distance between a surface of any one of the dented parts and the first surface of the substrate is less than a distance between the first surface of the substrate and the second top surface of any one of the sensing components, and a distance between a surface of any one of the protuberance parts and the first surface of the substrate is larger than a distance between the first surface of the substrate and the light emitting surface of any one of the micro light emitting diodes.

9. The display panel of micro light emitting diode according to claim 1, further comprising a plurality of touch components disposed on the substrate and in the display area, wherein the shading layer covers the touch components.

10. The micro light emitting diode according to claim 1, wherein the micro light emitting diodes comprises a plurality of red micro light emitting diodes, a plurality of green micro light emitting diodes and a plurality of blue micro light emitting diodes, and a distance between the first surface of the substrate and the light emitting surface of any one of the red micro light emitting diodes, a distance between the first surface of the substrate and the light emitting surface of the green micro light emitting diodes and a distance between the first surface of the substrate and the light emitting surface of the blue micro light emitting diodes are different.

11. The display panel of micro light emitting diode according to claim 10, further comprising a plurality of pixels, wherein each of the plurality of pixels includes at least one red micro light emitting diode, at least one green micro light emitting diode and at least one blue micro light emitting diode.

12. The display panel of micro light emitting diode according to claim 1, wherein the shading layer has a second surface, and a distance between the second surface of the shading layer and the first surface of the substrate is larger than a distance between the first surface of the substrate and a first top surface of any one of the driving chips, and a distance between the second surface of the shading layer and the first surface of the substrate is less than a distance between the first surface of the substrate and the light emitting surface of any one of the micro light emitting diodes.

* * * * *